United States Patent [19]

Ecklund

[11] 4,410,762

[45] Oct. 18, 1983

[54] DUAL MODE TONE DETECTOR CIRCUIT

[75] Inventor: Lawrence M. Ecklund, Wheaton, Ill.

[73] Assignee: Motorola, Inc., Schaumburg, Ill.

[21] Appl. No.: 262,839

[22] Filed: May 12, 1981

[51] Int. Cl.³ .............................................. H04H 5/00
[52] U.S. Cl. ...................................... 381/15; 307/522;
328/136
[58] Field of Search ................. 179/1 D, 1 G, 1 GM,
179/1 GN, 1 GS; 307/354, 360, 518, 520, 522;
328/136, 140; 340/825.71, 827.72; 455/154,
156, 158, 159

[56] References Cited

U.S. PATENT DOCUMENTS

| | | | |
|---|---|---|---|
| 4,013,967 | 3/1977 | Fassbind | 307/354 X |
| 4,015,144 | 3/1977 | Brouckaert | 307/360 X |
| 4,031,463 | 6/1977 | Norberg | 307/360 X |
| 4,139,851 | 2/1979 | Risko | 307/360 X |
| 4,159,398 | 6/1979 | Hilbert et al. | 179/1 GS |
| 4,245,348 | 1/1981 | Imazeki | 455/158 |

Primary Examiner—A. D. Pellinen
Attorney, Agent, or Firm—Margaret Marsh Parker;
James W. Gillman; James S. Pristelski

[57] ABSTRACT

A low frequency tone detector filters out undesired frequencies in a received signal, than a latching circuit locks on when a given number of low frequency cycles are detected, having at least a predetermined peak amplitude. Thereafter, only a second given number of missing or low amplitude cycles will reset the latch. When the detector determines that the received signal is weak or of very poor quality, false detect signals are essentially prevented. The circuit is particularly suited to use with AM stereophonic signals where a low frequency tone is added to the difference channel for providing mono/stereo indication and mode switching.

11 Claims, 6 Drawing Figures

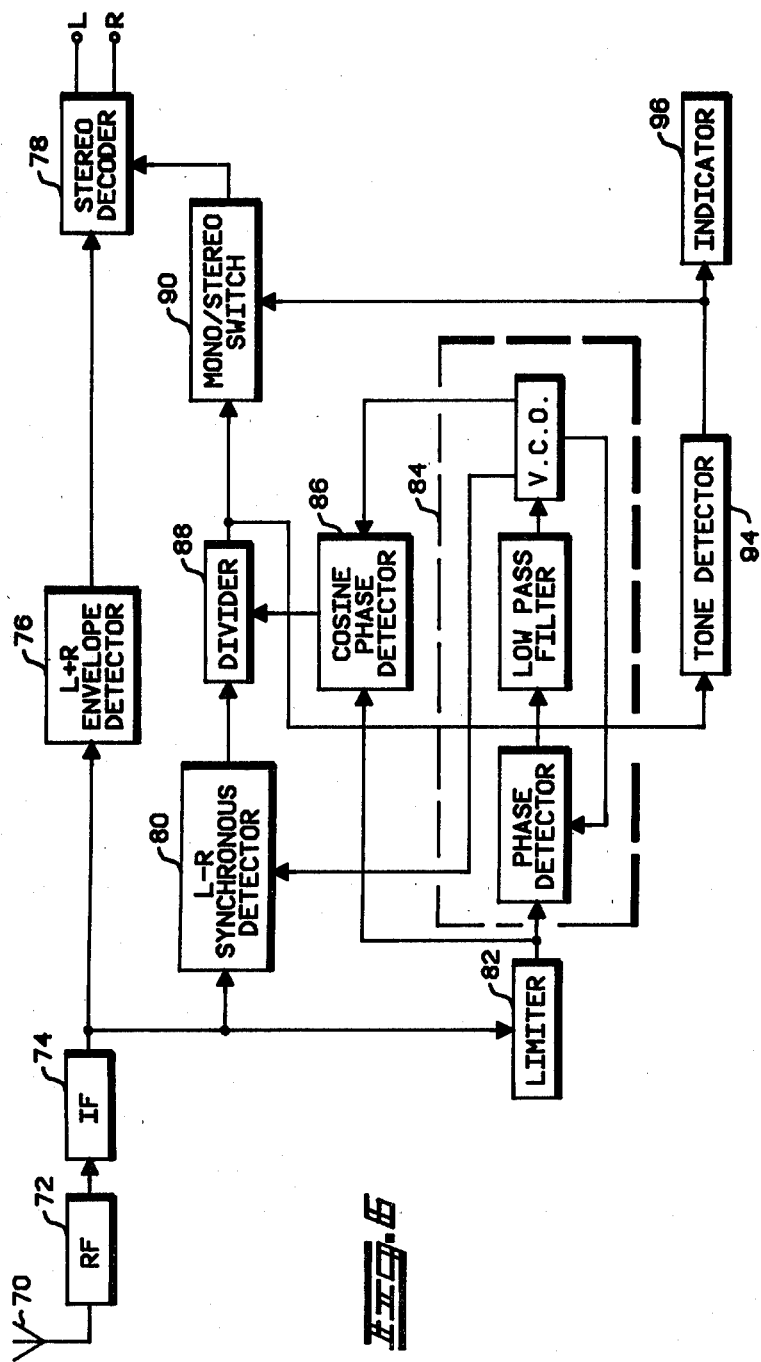

DUAL MODE TONE DETECTOR CIRCUIT

BACKGROUND OF THE INVENTION

This invention relates to the field of tone detectors as for use with stereophonic signals especially and, more particularly, to a detector with improved falsing protection in the presence of noisy signals.

Many tone detectors are known which consist mainly of low-pass or bandpass filters, active or passive, with the output rectified to obtain a DC mode-controlling signal. One such system is shown in U.S. Pat. No. 4,159,398, assigned to the assignee of the present invention. The patent discloses AM stereophonic transmission and reception of a signal including a very low frequency "stereo presence signal" or pilot tone. One problem which can arise with a simple filter/rectifier combination is that false stereo indication signals can be triggered by noise or other signals at or very near the tone frequency. The user of the stereophonic receiver having a falsing problem may see a flickering indicator lamp and hear the audio move back and forth between the "middle" or monophonic position and the separated stereo positions.

A circuit which solved most of this falsing problem has been shown in a co-pending application Ser. No. 218,878, assigned to the assignee of the present invention. That circuit forms the foundation of the present invention as will be apparent in the Detailed Description of the Preferred Embodiment. In general, that circuit must detect a given number of cycles of the desired frequency before signalling a "detect", then must detect a given number of missing cycles before singalling "non-detect". Thus, a missed cycle or two will not affect receiver operation or stereo indication. While this prior circuit is completely workable, it is possible to receive a number of false detects from the signals being received if the desired signal is very weak and there is co-channel interference.

SUMMARY OF THE INVENTION

It is, therefore, an object of the present invention to provide a tone detector which is essentially false-free.

It is a particular object to provide such a tone detector for operation with noisy input signals.

It is another object to provide a tone detector suitable for use with AM stereophonic receivers.

These objects and others which will become apparent are obtained in a circuit for receiving signals which may include one signal of a predetermined, very low frequency. The received signals are filtered to eliminate all signals at frequencies apart from the predetermined frequency. The filter output is coupled to a latching circuit which provides one output signal when a give number of cycles having a given amplitude have been detected in sequence, and a second output signal when a given number of cycles is lacking or of insufficient amplitude.

If, however, the filter output includes one or more cycles of the given amplitude followed by a longer series of cycles having less than the given amplitude, a timer is enabled so that any subsequent pulse of the given amplitude will block any "detect" signal for a predetermined period. Any repetition of this signal sequence will retrigger the timer. When the received signal is reasonably strong, the potential for falsing is greatly reduced and the circuit is able to function in the simpler mode described previously.

BRIEF DESCRIPTION OF THE DRAWING

FIG. 6 is a block diagram illustrating one application of the invention.

DETAILED DESCRIPTION OF THE PREFERRED EMBODIMENT

Figure 1:
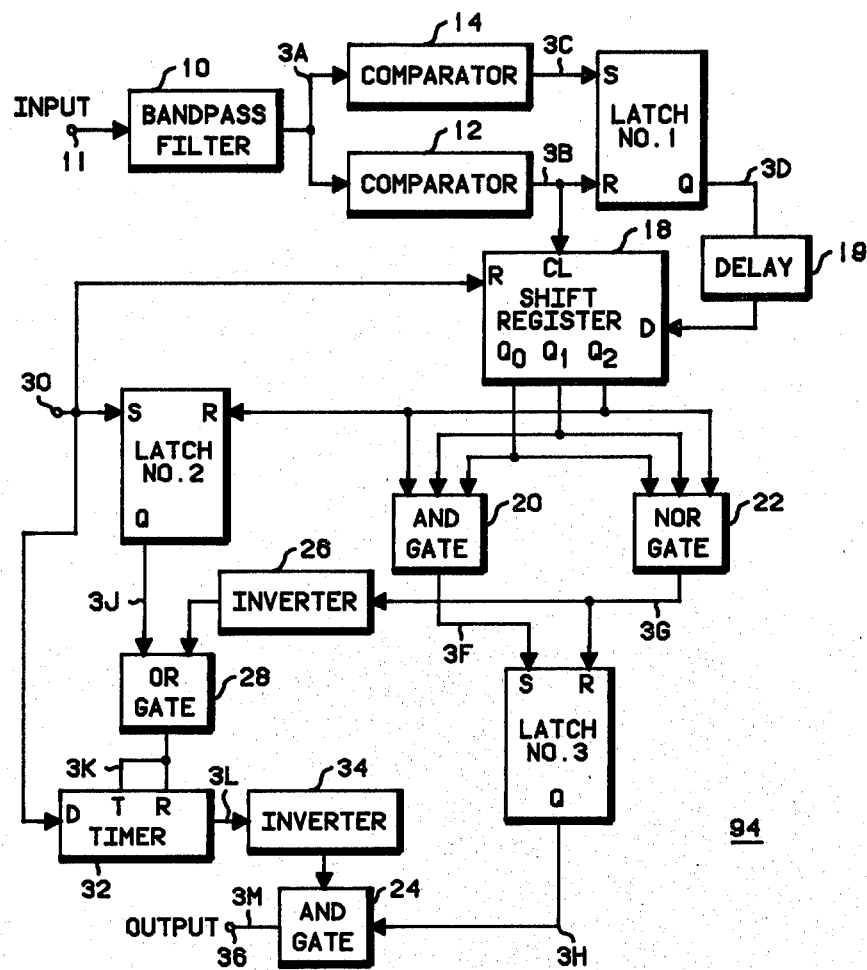
FIG. 1 is a block diagram of the detector of the invention.

In the block diagram of FIG. 1, the input to a bandpass filter 10 at an input terminal 11 will normally be comprised of a wide range of frequencies. In most applications, these will be audio frequencies including one particular frequency which it is desired to detect for some control purpose. One specific application will be described, namely, an AM stereophonic receiver wherein a pilot tone is included in the received stereo signal, but the invention is not to be construed as limited thereto. It is, in fact, applicable to any apparatus where it is necessary to not only detect a single frequency in a received signal, but to prevent false detect signals even when noise or other interfering signals are present.

The filter 10 will preferably be a very narrow bandpass filter, although it is possible that a low-pass, high-pass or wider bandpass filter might be used in particular applications. The output of the filter 10 is coupled separately to two comparators 12, 14. The output of the comparator 12 is coupled to the "reset" input of a latch L1 and to the "clock" input of a shift register 18. The output of the comparator 14 is coupled to the "set" input of the latch L1. The latch L1 output is coupled to the data input of the register 18, and this interconnection may include a delay 19 if needed. The register outputs are coupled in parallel to two logic gates, an AND gate 20 and a NOR gate 22. For purposes of simplification, only three output terminals Q0, Q1, Q2 of the register 18 are shown, but it will be apparent that any desired number "n" of outputs can be utilized, the number typically being from four to six. The Q2 (or Qn) output of the register 18 is coupled to the "reset" input of a latch L2. The AND gate 20 output is coupled to the "set" input of a latch L3 and the NOR gate 22 output is coupled to the "reset" input of latch L3. The latch L3 output is coupled to an AND gate 24.

The NOR gate 22 output is also coupled through an inverter circuit 26 to one input of an OR gate 28 whose other input is the output of the latch L2. Latches L1–L3 may be inplemented by three of the sections of a quad NOR R-S latch such as the Motorola 14043B. The shift register 18 may be implemented by a dual four-bit static shift register such as the Motorola MC14015. The "reset" of the shift register 18 and the "set" of the latch L2 can be coupled via an input terminal 30 to an external circuit (not shown) such as an out-of-lock detector, for shutting down the tone detector circuit during tuning. The output of the OR gate 28 is coupled to the "trigger" and "reset" inputs of a timing circuit 32 such as a Motorola MC1555. A typical time delay would be 750 msec for a 25 Hz tone. The time output is coupled through an inverting circuit 34 to a second input of the AND gate 24, the output of the gate 24 being available for control purposes at a terminal 36.

Figure 2:
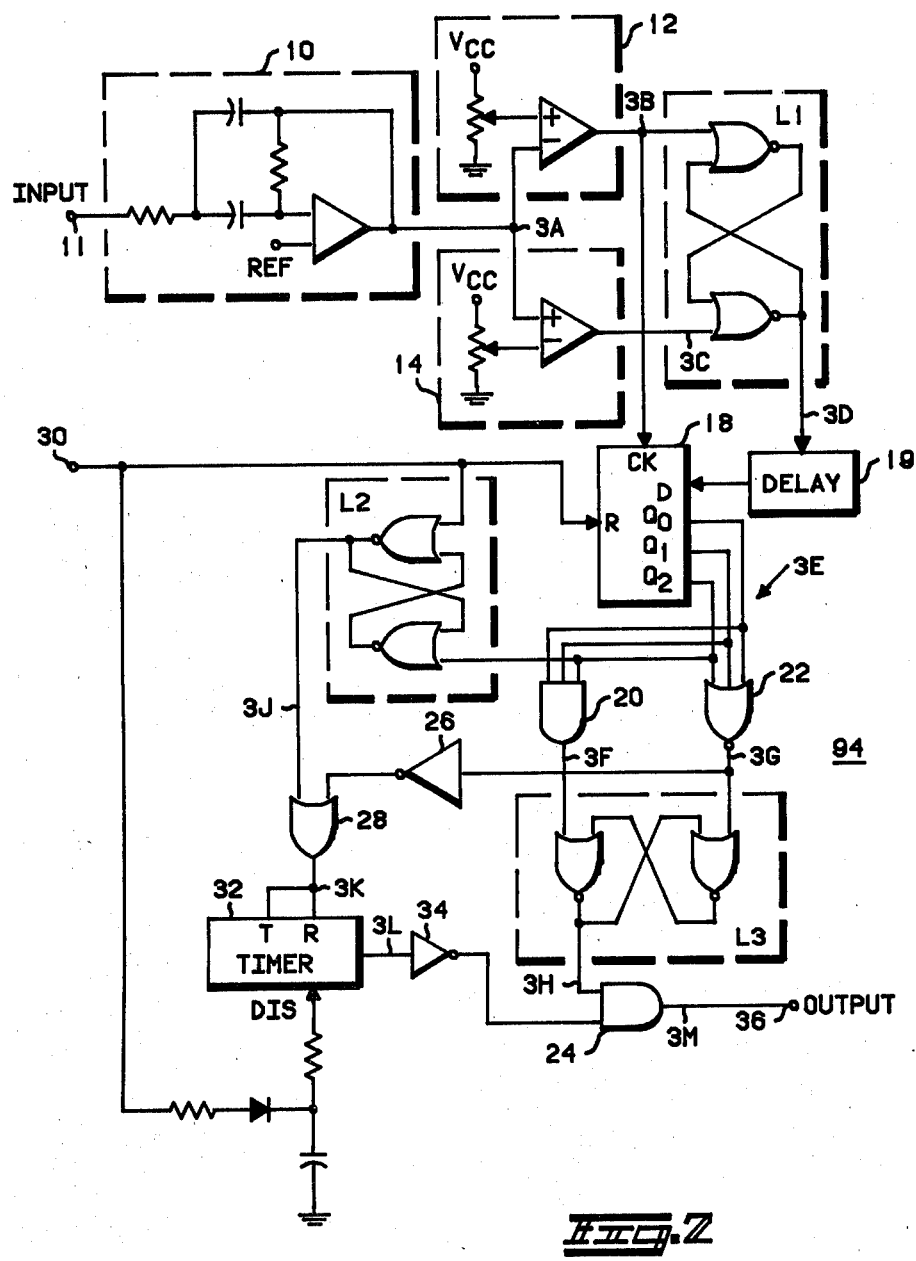
FIG. 2 is a logic diagram of the detector of FIG. 1.

FIG. 2 shows in logic/schematic form the tone detector circuit of FIG. 1 and will be explained in conjunction with the timing chart of FIG. 3. As explained above, the signals at the input 11 of the filter 10 may be comprised of many frequencies, but the filter output signal will be essentially a sine wave (3A), depending on the design of the filter circuit. The maximum amplitude will, of course, vary and may possibly go to zero for short periods. The signal 3A is coupled to the comparators 12, 14 which have different threshold levels. The threshold for the comparator 12 may be at or near zero so that the comparator functions essentially as a zero crossing detector. Since there will normally be sufficient extraneous signals at or near the tone frequency to trigger the comparator 12, the output (3B) of the comparator will be a fairly regular square wave at the tone frequency. In addition to serving as the reset signal for the latch L1, signal 3B serves as the clock input signal for the shift register 18.

Figure 3:
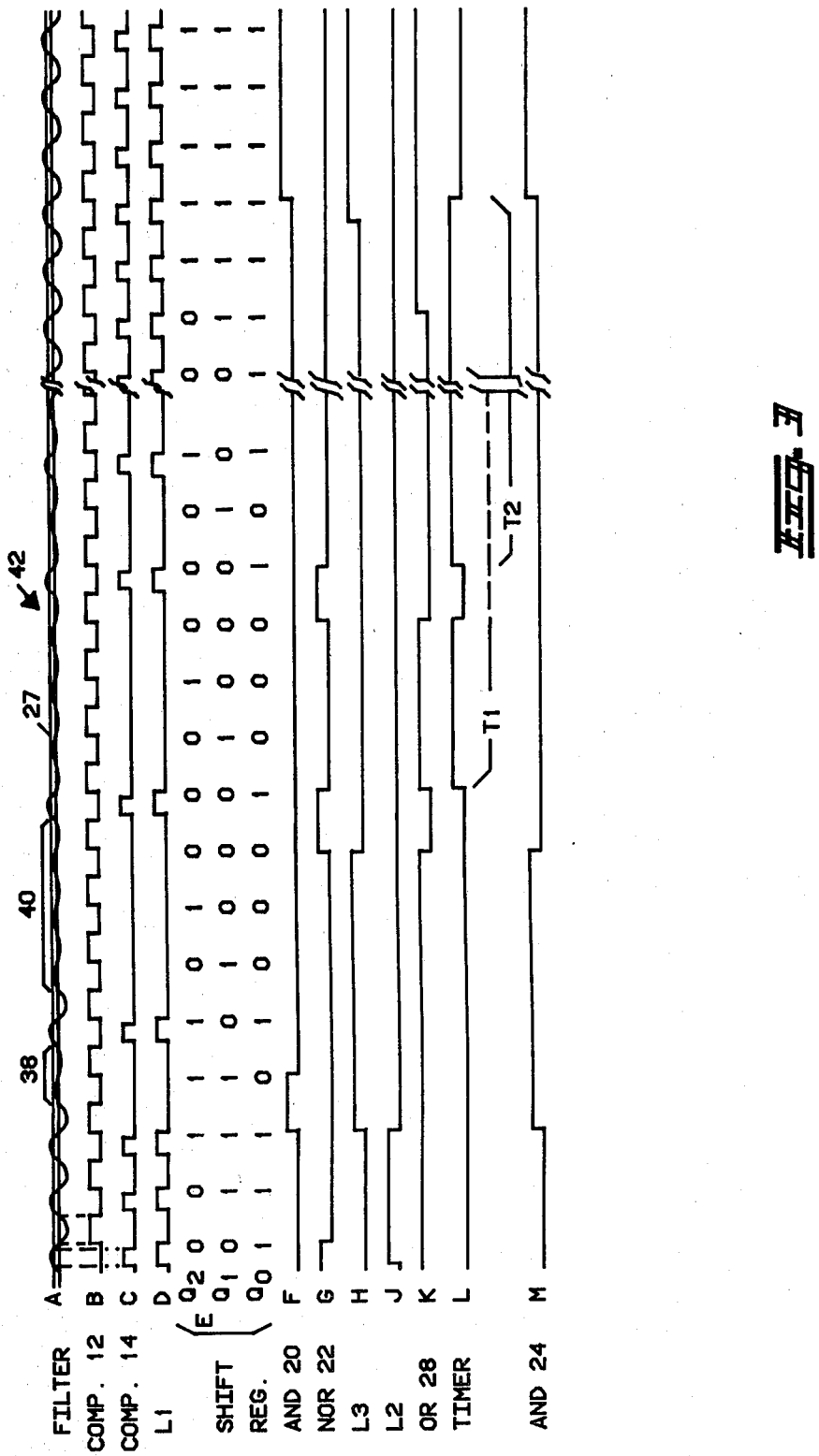
FIG. 3 is a timing diagram relating to the operation of the detector.

The threshold for the comparator 14, as indicated by line 27 of FIG. 3, will preferably be set at some point near but lower than the expected peak amplitude of the tone signal. The output pulses (3C) of the comparator 14 will thus be narrower than the pulses of 3B. The latch L1 is set by the leading edge of 3C and reset by the leading edge of 3B.

The latch L1 output 3D is coupled to the "data" input of the shift register 18. Line 3E shows only three parallel outputs of the register 18 for drawing simplicity, but it is likely that more outputs would be used for practical embodiments. At the first detection of a signal having the proper frequency and amplitude, a "one" would be coupled from the latch L1 to the shift register and, when clocked in, a one would appear at the Q0 output of the register for a parallel output of 0-0-1. At the second and third consecutive detects, the register outputs would be 0-1-1 and 1-1-1, respectively. At the third detect, all inputs to the AND gate 20 are one's, thus a one is coupled to the set input of the latch L3, and the latch output becomes a one as seen in signal 3H.

If, after latch L3 has been latched, one cycle of the tone signal is missing or of too low a value (as in the period 38), one pulse of 3C will be missing and the register 18 outputs will become 1-1-0, but the latch L3 will stay latched. If, however, three pulses of 3C are missing or are too low, as in the period 40, the shift register outputs will become 0-0-0. Since the shift register outputs are also the NOR gate 22 inputs, the NOR gate will now output a one, resetting the latch L3 and causing the latch output to go to zero. The latch L3 output 3H will then stay at zero until three consecutive good cycles have been detected in the filter output signal 3A. It is to be noted that the AND gate 20 and NOR gate 22 need not have the same number of inputs; in other words, the number of consecutive cycles required to set the latch L3 will not necessarily be the same number of missing cycles required to reset the latch L3.

The signal from the input terminal 30 is also coupled to the set input of latch L2 and the Q2 output of the register 18 is coupled to the reset input. When a one appears at Q2, the latch L2 output 3J will go low and stay low. If a series of zeros then appears in signal 3D, filling register 18 so that the NOR 22 output 3G goes high, the signal out of the inverter 26 (on the second input of the OR gate 28) will put a falling waveform on the trigger/reset of the timer 32. This falling waveform will reset the timer 32, so that the next "one" from L1 will start the timing period T1, which puts a zero on one input of the AND 24. The output at the terminal 36 is then also a zero or "no pilot tone" signal.

If, during the period T1, three Zero's again fill the register 18, (as at the point 42 of FIG. 3), the timer 32 will be reset by another falling waveform from the OR gate 28. The next one in the shift register 18 will start timing period T2. Even though the shift register 18 is subsequently filled with one's, setting the latch L3 high, no pilot detect signal will be produced at the terminal 36 until the period T2 is over since the detector has reason to believe that the one's may not represent a stereo signal. During reception of a monophonic signal, occasional one's (false detects) will not be able to cause a "stereo detect" output signal at the terminal 36. Thus, during a period of very noisy signals, the pilot detector is prevented from falsing.

Figure 4:
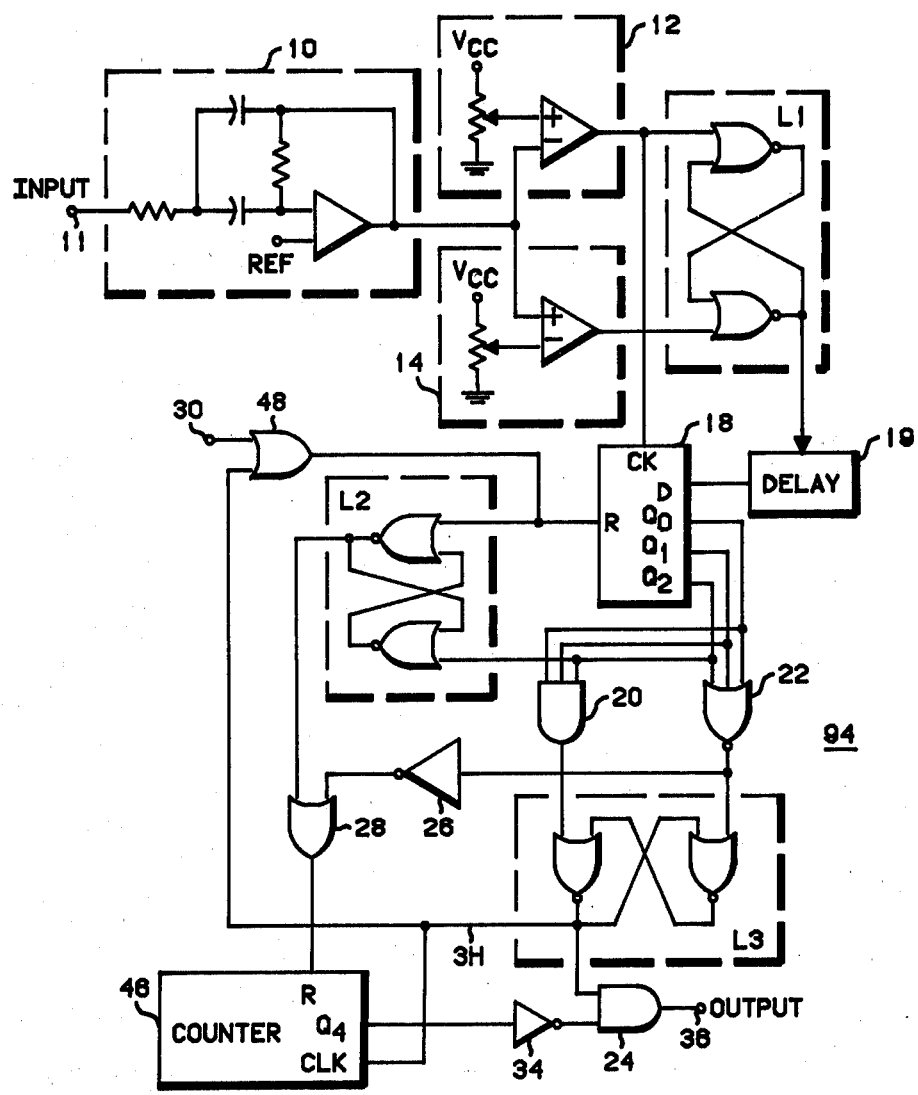
FIG. 4 is a logic diagram of a variation of the embodiment of FIG. 1.

FIG. 4 is a variation of FIG. 2 wherein the timer 32 is replaced by a counter 46, whose clock input is coupled to receive the output signal 3H of the latch L3. The signal 3H is also coupled to an OR gate 48 which also receives the signal from the input terminal 30. The output signal from the OR gate 48 is the reset signal for the register 18 and the set signal for latch L2. Thus the latch L2 goes high and register 18 is cleared each time the latch L3 outputs a one until the timer is timed out.

Figure 5:
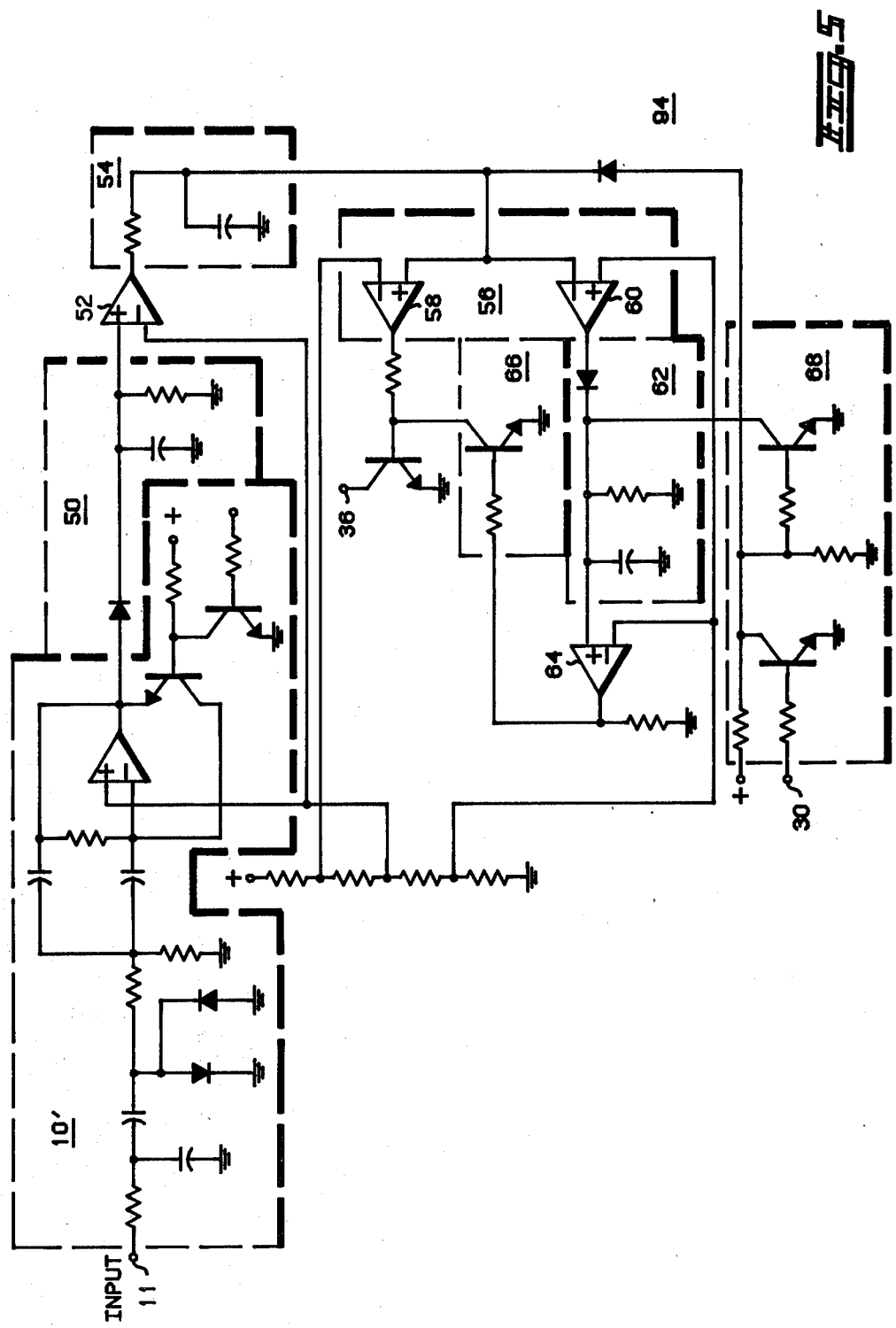
FIG. 5 is a schematic diagram of a second embodiment of the detector.

In FIG. 5, another embodiment of the detector is shown wherein the received signals at the terminal 11 are filtered in a bandpass filter 10' and coupled to a peak detector 50 with a time constant long enough so that the signal coupled to an amplifier 52 stays above the reference voltage at the amplifier's negative input terminal as long as a pilot signal is present. During a loss of pilot signals, the positive input would typically stay above the negative input level for 60 milliseconds. The amplifier 52 converts the signal to ones or zeroes which are then integrated in an integrating circuit 54. The integrator output signal will be an essentially smooth up-ramp as long as pilot signals are being detected and until a positive maximum voltage is reached. If, then, pilot signals are missing for a period of time, the integrator output will ramp down to zero. The integrator output is coupled to a window detector 56 which includes two comparators 58, 60 with different thresholds, both lower than the maximum voltage of the integrator. If the comparator 58 of the window detector is tripped in the positive direction, indicating a pilot tone, an output high will appear at the terminal 36. If the integrator output goes below the lower threshold (of comparator 60), a delay circuit 62 is charged. A buffer amplifier 64 couples the delay circuit output to a switching circuit 66 for defeating the pilot detect signal until the delay circuit 62 has discharged below the lower threshold of the window detector 56. The time constant of the delay circuit 62 may be much longer than the integrator ramp time, thus reducing the chances of a false detect when the received signals are very noisy or include co-channel interference. As in the other embodiments, the terminal 30 will provide an out-of-lock signal which, through a second switching circuit 68, will disenable the tone detector during tuning. The out-of-lock signal will also reset the DC level at the output of the integrator 54 to the center point of the window detector 56.

In one application of the invention, the tone to be detected is a low audio or near infrasonic frequency (20-25 Hz) which has been added to the difference channel (L-R) of an AM stereophonic transmission. The receiver shown in FIG. 6 is similar to the receiver of U.S. Pat. No. 4,192,968. That receiver was designed to receive an AM stereo signal of the form $(1+L+R) \cos(\omega_c t + \phi)$ where $\phi$ is arc tan $[(L-R)/(1+L+R)]$. In the present receiver, provision has been made for also receiving a stereo signal wherein the signal in the difference channel includes a stereo presence signal SP, thus $\phi$ is arc tan $[(L-R+SP)/(1+L+R)]$.

The signal received at an antenna 70 is processed in normal fashion in an RF stage 72 and an IF stage 74, and the intermediate frequency signal is coupled to an envelope detector 76. The output (L+R) of the detector 76 is coupled to a stereo decoder 78 which may be a matrixing circuit. The IF signal is also coupled to a synchronous detector 80, the output of which will be essentially $(L-R+SP) \cos(\omega_c t + \phi)$, and to a limiter 82 whose output will contain only the phase modulation of the received signal $(\cos \omega_c t + \phi)$. The limiter output is coupled to a phase locked loop 84 and to a cosine phase detector 86. The PLL 84 output $(\cos \omega_c t)$ is also coupled to the cosine phase detector 86, and the detector 86 output $(\cos \phi)$ is coupled to a divider 88 where it is divided into the synchronous detector output $(L-R+SP) \cos \phi$. The divider 88 output will then be $(L-R+SP)$ and this signal may be coupled through a mono/stereo switching circuit 90 to the decoder 78 since the very low frequency of the stereo presence tone can be coupled through the audio stages up to and including the speakers if so desired. Alternatively, the SP signal may be trapped or filtered out of the L-R channel if desired.

The divider output $(L-R+SP)$ is also coupled to the tone detector circuit 94 which may be any of the embodiments of FIGS. 1, 4 or 5. The detector circuit output (3M) at the terminal 36 is coupled to an indicator 96 for a visual indication of the reception of a stereophonic signal. It is also coupled to control the mono/stereo mode switch 90 since it is usually desirable to disconnect the difference signal from the matrix 78 when no L-R information is being received. The switch 90 could be a simple voltage controlled switching transistor or a more complex circuit.

Thus, there has been shown and described a circuit for detecting one signal in a group of signals which may have varying amplitudes and frequencies. The circuit is latched, indicating a tone detect, when a predetermined number of consecutive cycles of the one signal frequency have been detected, each cycle having a suitable amplitude, and the circuit is delatched only when a predetermined number of consecutive cycles have less than the suitable amplitude. In the presence of very weak and noisy signals or co-channel interference, the tone detector will switch to a second mode of operation wherein it is even more difficult for a false detect to occur. In this latter mode, the possibility of a false tone detect, even with poor received signals, is essentially eliminated. Other modifications and variations of the circuit shown are possible and it is intended to cover all such as fall within the spirit and scope of the appended claims.

What is claimed is:

1. Dual mode tone detector means comprising:
   input means for receiving signals which may include one signal of a predetermined frequency;
   filter means coupled to the input means for outputting only those received signals at or near the predetermined frequency;
   first circuit means coupled to the filter means output and including comparator means for determining the peak amplitude of each filtered signal cycle, shift register means coupled to the comparator means, and logic means coupled to the shift register means outputs for providing a first output signal only in response to the reception of a first predetermined number of consecutive cycles of said signal frequency, each said cycle having at least a predetermined peak amplitude, and a second output signal only in response to the reception of a second predetermined number of consecutive cycles of said signal frequency having an absolute value less than the predetermined peak amplitude;
   second circuit means coupled to the shift register means outputs and the logic means output and including timing means for providing a timed output signal of a predetermined period in response to the reception of the second predetermined number of consecutive cycles having an absolute value less than the predetermined peak amplitude, said second predetermined number of cycles following at least one cycle having at least the predetermined peak amplitude and gating means; and
   means coupled to the first and second circuit means and responsive to the first and second output signals, the gating means decoupling the responsive means from the logic means during said timed output signal.

2. Dual mode tone detector means in accordance with claim 1 wherein the received signals are broadcast signals and the input means includes at least an RF stage, circuits coupled to the RF stage for providing a signal of an intermediate frequency in response to the RF stage output and modulation detector means coupled to said circuits for detecting modulation on the intermediate frequency signals.

3. Dual mode tone detector means in accordance with claim 1 wherein the signal of a predetermined frequency is a very low audio frequency and the filter means is a low-pass filter.

4. Dual mode tone detector means in accordance with claim 1 wherein the filter means is a bandpass filter centered at the predetermined frequency.

5. Dual mode tone detector means in accordance with claim 1 and wherein the comparator means includes a first comparator having a first detect threshold and coupled to receive the output of the filter means, a second comparator having a second detect threshold, the second threshold being higher than the first threshold, and being coupled to receive the output of the filter means, and wherein a first latching means is coupled to be set by the first comparator and reset by the second comparator, the shift register means is coupled to be clocked by the second comparator and includes a data input coupled to the first latching means, and the logic means includes first and second logic gates coupled to receive the register outputs and a second latching means is coupled to be set and reset by the respective logic gate outputs.

6. Dual mode tone detector means in accordance with claim 5 and wherein the first logic gate is an AND gate and provides an output in response to the first predetermined number of consecutive 1's at the output of the register means, and the second logic gate is a NOR gate and provides an output in response to the second predetermined number of consecutive 0's at the output of the register means.

7. Dual mode tone detector means in accordance with claim 1 wherein the responsive means coupled to the logic means includes a switching circuit controlled by an external signal.

8. Dual mode tone detector means in accordance with claim 1 wherein the responsive means coupled to the logic means includes an indicator.

9. Dual mode tone detector means in accordance with claim 1 and further including a second input means coupled to the timing means for enabling the timed output signal in response to an input signal from the second input means.

10. A receiver for receiving a carrier wave which is modulated with signal information proportional to M+N where M is the amplitude of an intelligence signal and N is the amplitude of an indicator signal, the receiver comprising in combination: means for selectively receiving the modulated carrier wave; means for translating the received carrier wave to one of an intermediate frequency;

circuitry coupled to the translating means for providing an output signal proportional to M;

filter means coupled to the translating means for outputting only those signals at or near the frequency of said indicator signal;

first circuit means coupled to the filter means output and including comparator means for determining the peak amplitude of each detected cycle; shift register means coupled to the comparator means, and logic means coupled to the shift register means outputs for providing a first output signal only in response to the reception of a first predetermined number of consecutive cycles of said signal frequency, each said cycle having at least a predetermined peak amplitude, and a second output signal only in response to the reception of a second predetermined number of consecutive cycles of said signal frequency having an absolute value less than the predetermined peak amplitude;

second circuit means coupled to the shift register means outputs and the logic means output and including timing means for providing a timed output signal of a predetermined period in response to the reception of the second predetermined number of consecutive cycles having an absolute value less than the predetermined peak amplitude, said second predetermined number of cycles following at least one cycle having at least the predetermined peak amplitude and gating means for decoupling the responsive means from the logic means during said timed output signal.

11. A receiver in accordance with claim 10 wherein said intelligence signal M is the L−R signal of the compatible AM stereophonic signal (1+L+R) cos (wt+$\phi$) where $\phi$ is arc tan $[(L-R+N)/(1+L+R)]$.

* * * * *